United States Patent
Cha

(10) Patent No.: US 11,760,206 B2
(45) Date of Patent: Sep. 19, 2023

(54) SYSTEM AND METHOD FOR CONTROLLING COOLING OF PE PART OF ELECTRIC VEHICLE

(71) Applicants: Hyundai Motor Company, Seoul (KR); Kia Corporation, Seoul (KR)

(72) Inventor: Jung Min Cha, Hwaseong-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 354 days.

(21) Appl. No.: 17/341,659

(22) Filed: Jun. 8, 2021

(65) Prior Publication Data

US 2022/0144101 A1    May 12, 2022

(30) Foreign Application Priority Data

Nov. 9, 2020    (KR) .................. 10-2020-0418235

(51) Int. Cl.
| | |
|---|---|
| B60L 15/20 | (2006.01) |
| B60K 11/02 | (2006.01) |
| H05K 7/20 | (2006.01) |
| G07C 5/08 | (2006.01) |
| B60K 1/00 | (2006.01) |

(52) U.S. Cl.
CPC .............. *B60L 15/20* (2013.01); *B60K 11/02* (2013.01); *G07C 5/0825* (2013.01); *H05K 7/20945* (2013.01); *B60K 1/00* (2013.01); *B60K 2001/003* (2013.01)

(58) Field of Classification Search
CPC .. B60L 15/20; B60L 15/2018; B60L 2240/26; B60K 11/02; B60K 1/00; B60K 2001/003; B60K 28/04; G07C 5/0825; H05K 7/20945
See application file for complete search history.

(56) References Cited

U.S. PATENT DOCUMENTS

2013/0134778 A1*  5/2013  Tamanaha ................ H02J 7/04
                                                   307/10.1

* cited by examiner

*Primary Examiner* — Jacob M Amick
(74) *Attorney, Agent, or Firm* — Slater Matsil, LLP

(57) ABSTRACT

A system for controlling cooling of a power electronics (PE) part of an electric vehicle includes a driving load determiner configured to estimate a weight of the vehicle and to determine a driving load level based on the estimated weight, and a PE part temperature controller configured to change a cooling start reference temperature of the PE part depending on the determined driving load level.

19 Claims, 3 Drawing Sheets

SYSTEM AND METHOD FOR CONTROLLING COOLING OF PE PART OF ELECTRIC VEHICLE

CROSS-REFERENCE TO RELATED APPLICATIONS

This application claims the benefit of Korean Patent Application No. 10-2020-0148235, filed on Nov. 9, 2020, which application is hereby incorporated herein by reference.

TECHNICAL FIELD

The present disclosure relates to a system and a method for controlling cooling of a power electronics (PE) part of an electric vehicle.

BACKGROUND

In the case of an electric vehicle, power electronics (PE) parts including a motor for travel, a reducer, and the like are installed, unlike an internal combustion engine vehicle using an engine.

For reference, the PE parts are parts such as an inverter, a reducer, or a battery as well as a motor for travel of a vehicle.

When a PE part is continuously overloaded, the temperature rises, the performance is degraded, and the PE part deteriorates, and thus the PE part is cooled by a cooling system using a coolant.

To this end, a cooling system for the PE part includes an electric water pump, a radiator, a water-cooling chiller, or the like.

Thus, the coolant exchanges heat with PE parts using the water-cooling chiller as a medium while being circulated in the PE parts by driving the electric water pump, and the coolant, the temperature of which is increased through heat exchange, is cooled again through the radiator, and then, circulates and flows in the PE part.

When the temperature of the motor of the PE parts is equal to or greater than a predetermined level, control of limiting power output of the motor by lowering motor RPM is performed in order to lower the temperature of the motor.

The load of the PE part during travel is increased due to an increase in the weight of the electric vehicle (e.g., an increase in the weight due to a payload), and thus the temperature of the PE part rapidly increases, thereby degrading the performance of the PE part and causing deterioration of the PE part.

For example, when a small business operator loads goods in a vehicle and drives the vehicle, the power of the motor of the PE parts is increased due to an increase in the weight of the vehicle, and thus the temperature of the motor rapidly increases, thereby degrading the performance of the PE parts and causing deterioration of the PE parts.

In addition, when the temperature of the PE parts rapidly increases due to an increase in the weight of the electric vehicle, the PE parts are cooled using a water-cooling chiller using high power consumption, unlike a radiator using relatively low power consumption, thereby degrading energy efficiency.

SUMMARY

The present disclosure relates to a system and a method for controlling cooling of a power electronics (PE) part of an electric vehicle. Particular embodiments relate to a system and a method for controlling cooling of a PE part for preventing the PE part from being damaged and reducing consumption of current for cooling by changing a cooling start temperature of the PE part depending on a change in the weight of the vehicle and a driving load condition.

In one aspect, embodiments of the present disclosure provide a system and a method of controlling cooling of a power electronics (PE) part of an electric vehicle for preventing the performance of the PE part from being degraded and reducing consumption of current for cooling by estimating and determining the weight of the vehicle and differentiating the cooling start temperature of the PE part for each estimated weight level.

In a preferred embodiment, a system for controlling cooling of a power electronics (PE) part of an electric vehicle includes a driving load determiner configured to estimate a weight of the vehicle and to determine a driving load level based on the estimated weight, a PE part temperature controller configured to change a cooling start reference temperature of the PE part depending on the determined driving load level, and a pop-up notification controller configured to provide a driver with information indicating that the cooling start reference temperature of the PE part is changed.

The driving load determiner may include a weight estimator configured to estimate the weight of the vehicle using a driving force of the vehicle and a slope, and a driving load level determiner configured to determine any one of a plurality of preset driving load levels, to which the estimated weight belongs.

The PE part temperature controller may be configured to apply a first cooling control map in which the cooling start reference temperature of the PE part is set to a predetermined temperature or greater when the determined driving load level is a normal load level, and to apply a second cooling control map in which the cooling start reference temperature of the PE part is set to be less than the predetermined temperature when the determined driving load level is an overload level.

The second cooling control map may be configured by multiplying the first cooling control map by an offset or a factor based on a driving load level belonging to an overload level.

The second cooling control map may be configured to set the cooling start reference temperature of the PE part differently for each driving load level belonging to an overload level.

When the driving load level is an overload level, the pop-up notification controller may perform control of displaying a pop-up window indicating that smart care is currently performed on the PE part on an in-vehicle display.

In another embodiment, a method of controlling cooling of a power electronics (PE) part of an electric vehicle includes estimating a weight of the vehicle, determining a driving load level based on the estimated weight, changing a cooling start reference temperature of the PE part depending on the determined driving load level, and providing a driver with information indicating that the cooling start reference temperature of the PE part is changed through pop-up of the information.

The estimating of the weight of the vehicle may be performed according to $$m = \frac{\int_{t0}^{t1} \left[ \frac{\eta_{RD}}{r_{tire}} (\tau_{Mot}^{BeAj}) - (f_0 + f_1 v + f_2 v^2) \right] dt}{\left[ \Delta v + \int_{t0}^{t1} g \sin\theta dt \right]}$$

using a driving force of the vehicle and a slope, where m is an estimated weight, $\eta_{RD}$ is efficiency during deceleration, $r_{tire}$ is a dynamic radius of a tire, $\tau_{Mot}^{BeAj}$ is torque of a motor, $f_0$, $f_1$, and $f_2$ are driving loads, g is gravitational acceleration, and $\theta$ is a slope (an inclination angle).

The determining of the driving load level based on the estimated weight may include determining any one of a plurality of preset driving load levels, to which the estimated weight belongs.

The method may further include applying a first cooling control map in which the cooling start reference temperature of the PE part is set to a predetermined temperature or greater when the determined driving load level is a normal load level, and applying a second cooling control map in which the cooling start reference temperature of the PE part is set to be less than the predetermined temperature when the determined driving load level is an overload level.

The providing may include, when the driving load level is an overload level, displaying a pop-up window indicating that smart care is currently performed on the PE part on an in-vehicle display.

BRIEF DESCRIPTION OF THE DRAWINGS

The above and other features of the present disclosure will now be described in detail with reference to certain exemplary embodiments thereof illustrated in the accompanying drawings which are given hereinbelow by way of illustration only, and thus are not limitative of the present disclosure, and wherein.

DETAILED DESCRIPTION OF ILLUSTRATIVE EMBODIMENTS

Hereinafter reference will now be made in detail to various embodiments of the present disclosure, examples of which are illustrated in the accompanying drawings and described below.

Figure 1:
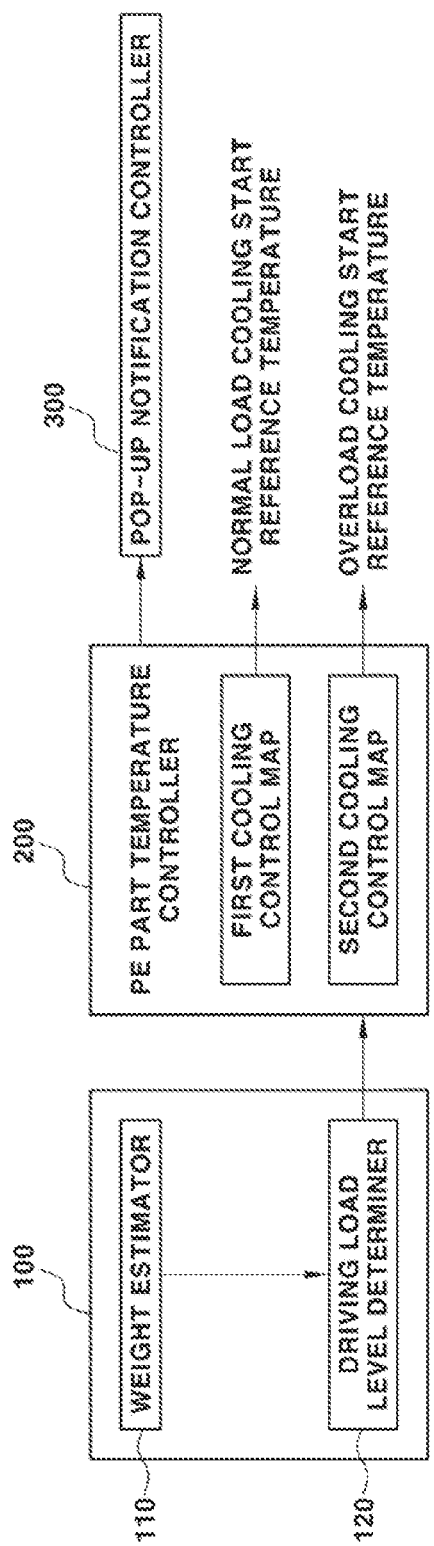
FIG. 1 is a diagram showing the configuration of a system for controlling cooling of a power electronics (PE) part of an electric vehicle according to embodiments of the present disclosure.
Figure 2:
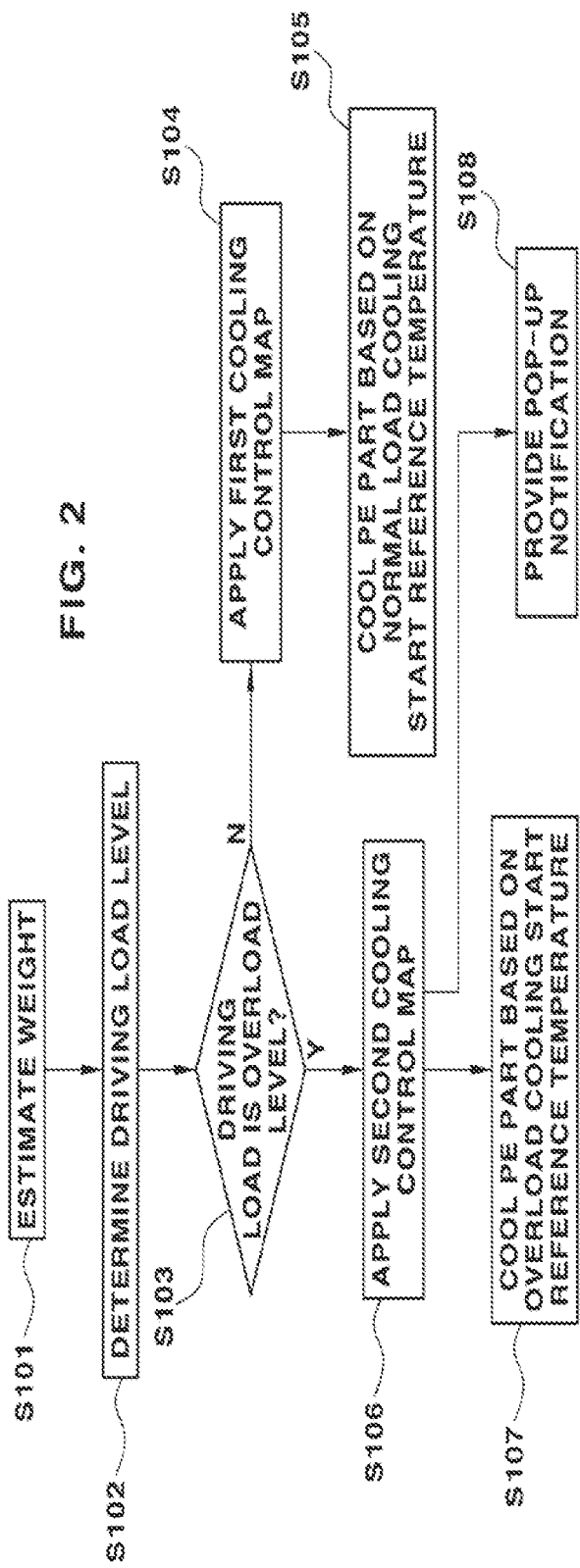
FIG. 2 is a flowchart showing a method of controlling cooling of a PE part of an electric vehicle according to embodiments of the present disclosure.

FIG. 1 is a diagram showing the configuration of a system for controlling cooling of a power electronics (PE) part of an electric vehicle according to embodiments of the present disclosure. FIG. 2 is a flowchart showing a method of controlling cooling of a PE part of an electric vehicle according to embodiments of the present disclosure.

As shown in FIG. 1, the system for controlling cooling of a PE part according to embodiments of the present disclosure may include a driving load determiner 100 for estimating the weight of a vehicle and determining a driving load level based on the estimated weight, a PE part temperature controller 200 for changing a cooling start reference temperature of the PE part depending on the determined driving load level, and a pop-up notification controller 300 for providing a driver with information indicating that the cooling start reference temperature of the PE part is changed.

The driving load determiner 100 may include a weight estimator 110 for estimating the gross weight of the vehicle using the driving force of the vehicle and a slope (an inclination angle) of a driving road, and a driving load level determiner 120 for determining any one of a plurality of preset driving load levels, to which the estimated weight belongs.

In one example, the driving load determiner 100 and the weight estimator 110 can be implemented in software. For example, the system may include a processor and a memory that stores program instructions that, when executed by the processor, will cause the processor to implement the functions of the driving load determiner 100 and the weight estimator 110 as described herein. One example of the implementation will now be described with respect to FIG. 2.

Referring now to FIG. 2, the weight of the vehicle is first estimated (S101).

To this end, the weight estimator 110 may estimate the weight of the vehicle under an accelerator pedal-on condition using Equation 1 below.

$$m = \frac{\int_{t0}^{t1} \left[ \frac{\eta_{RD}}{r_{tire}} (\tau_{Mot}^{BeAj}) - (f_0 + f_1 v + f_2 v^2) \right] dt}{\left[ \Delta v + \int_{t0}^{t1} g \sin\theta dt \right]} \quad \text{[Equation 1]}$$

In Equation 1 above, m is an estimated weight, $\eta_{RD}$ is efficiency during deceleration, $r_{tire}$ is a dynamic radius of a tire, $\tau_{Mot}^{BeAj}$ is torque of a motor, $f_0$, $f_1$, and $f_2$ are driving loads, g is gravitational acceleration, and $\theta$ is a slope (an inclination angle).

Then, the driving load level may be determined based on the estimated weight (S102).

To this end, the driving load level determiner 120 may determine any one of a plurality of preset driving load levels, to which the weight estimated by the weight estimator 110 belongs.

For example, when the weight estimated by the weight estimator 110 is 2,000 kg to 2,500 kg, the estimated weight is determined to belong to a driving load level 1 (LEVEL 1), when the estimated weight is 2,500 kg to 3,000 kg, the estimated weight is determined to belong to a driving load level 2 (LEVEL 2), when the estimated weight is 3,000 kg to 4,000 kg, the estimated weight is determined to belong to a driving load level 3 (LEVEL 3), and when the estimated weight is equal to or greater than 4,000 kg, the estimated weight is determined to belong to a driving load level 4 (LEVEL 4).

Then, the driving load level determiner 120 may transmit information obtained by determining any one of the plurality of preset driving load levels, to which the estimated weight of the vehicle belongs, to the PE part temperature controller 200.

Then, whether the determined driving load level is an overload level may be determined (S103).

A reference for determining a driving load level may be differently set for each vehicle type, and for example, when the weight of the vehicle belongs to the driving load level 1, the PE part temperature controller 200 may determine the current driving load level as a normal load level, when the weight of the vehicle belongs to the driving load level 2 or greater, the PE part temperature controller 200 may determine the current driving load level as an overload level, when the weight of the vehicle belongs to the driving load level 1 or the driving load level 2, the PE part temperature controller 200 may determine the current driving load level as a normal load level, and when the weight of the vehicle belongs to the driving load level 3 or greater, the PE part temperature controller 200 may determine the current driving load level as a overload level.

Then, the PE part temperature controller 200 may perform control of changing the cooling start reference temperature of the PE part by applying a first cooling control map or a second cooling control map depending on the driving load level determined as described above.

In operation S103 above, when the driving load level is determined as a normal load level (N at S103), the PE part temperature controller 200 may apply a first cooling control map in which the cooling start reference temperature of the PE part, that is, the normal load cooling start reference temperature, is set to a predetermined temperature or greater (S104).

Thus, the PE part temperature controller 200 may perform a procedure of cooling the PE part based on the normal load cooling start reference temperature by applying the first cooling control map in order to cool the PE part (S105).

Figure 3:
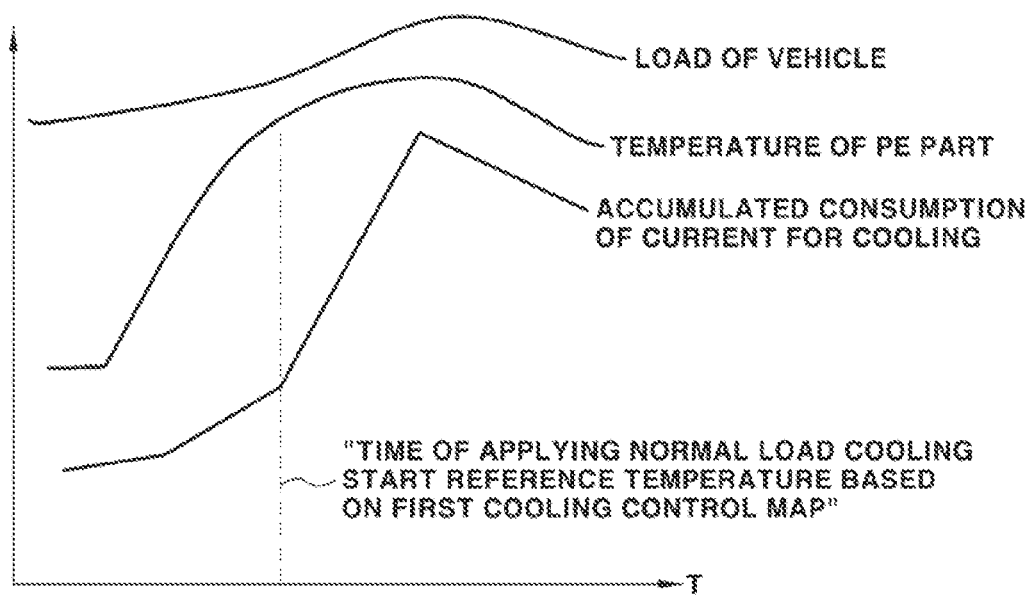
FIG. 3 is a control graph showing an example in which a normal load cooling start reference temperature is applied during a procedure of controlling cooling of a PE part of an electric vehicle according to embodiments of the present disclosure.

As seen from FIG. 3, an accumulated power consumption for cooling the PE part rapidly increases from the time at which the normal load cooling start reference temperature based on the first cooling control map is applied.

On the other hand, in operation S103 above, when the driving load level is determined as an overload level (Y at S103), the PE part temperature controller 200 may apply a second cooling control map in which the cooling start reference temperature of the PE part, that is, the overload cooling start reference temperature is set to a predetermined temperature or less (S106).

In detail, the second cooling control map may be configured by multiplying the first cooling control map by an offset or a factor based on a driving load level belonging to the overload level.

The second cooling control map may be configured to set the cooling start reference temperature of the PE part differently for each driving load level belonging to the overload level.

Thus, the PE part temperature controller 200 may perform a procedure of cooling the PE part based on the overload cooling start reference temperature by applying the second cooling control map in order to cool the PE part (S107).

Figure 4:
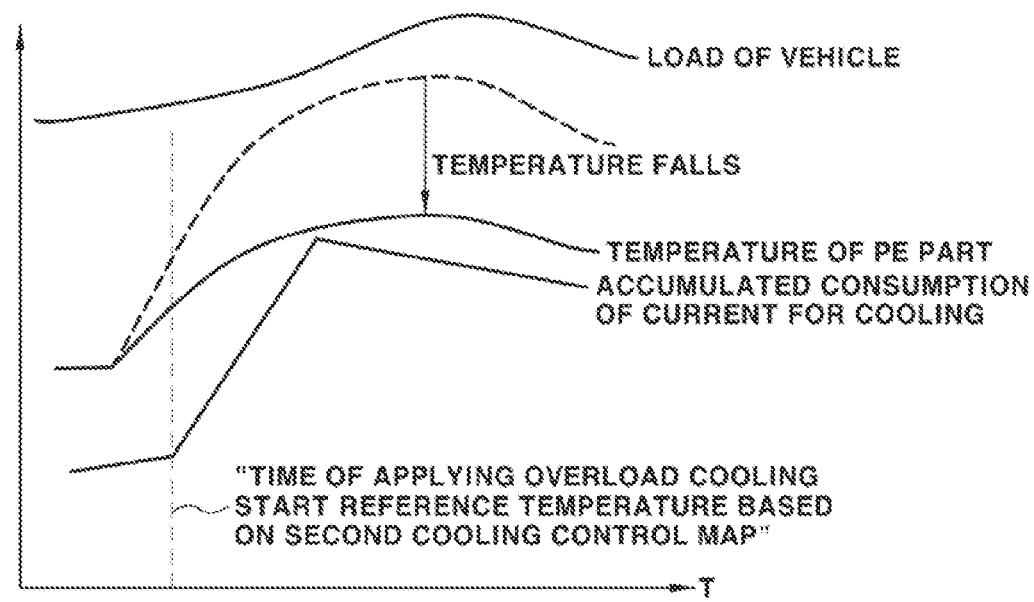
FIG. 4 is a control graph showing an example in which an overload cooling start reference temperature is applied during a procedure of controlling cooling of a PE part of an electric vehicle according to embodiments of the present disclosure.

As seen from FIG. 4, an accumulated power consumption for cooling the PE part is reduced from the time at which the overload cooling start reference temperature based on the second cooling control map is applied, compared with the case in which a previous cooling control map (the first cooling control map) is applied, which is because the overload cooling start reference temperature is set to be less than a predetermined temperature, as seen from FIG. 4.

As such, the PE part may be cooled in advance by lowering the cooling start reference temperature of the PE part under an overload driving condition of a vehicle, and thus the temperature of the PE part may be prevented from rapidly increasing, thereby preventing the performance of the PE part from being degraded and preventing the PE part from deteriorating, and consumption of current for cooling the PE part may be reduced compared with the conventional case in which consumption of current for cooling the PE part is high when the temperature of the PE part rises rapidly.

When the PE part temperature controller 200 applies the second cooling control map in which the overload cooling start reference temperature is set to be less than a predetermined temperature, a control signal for pop-up notification may be transmitted to the pop-up notification controller 300.

Then, when the driving load level is the overload level, the pop-up notification controller 300 may perform control of displaying a pop-up window indicating that smart care is currently performed on the PE part on an in-vehicle display when receiving the control signal for pop-up notification from the PE part temperature controller 200 (S108).

Thus, the driver may be notified about cooling control information, e.g., information about a differentiated cooling start temperature of the PE part for each driving load level through pop-up of information indicating that smart care is currently performed on the PE part through the in-vehicle display, thereby improving impression of a smart vehicle.

Embodiments of the present disclosure may provide the following effects through the aforementioned solutions to problems.

First, the weight of a vehicle may be estimated without a separate weight detection sensor, a driving load level may be determined based on the estimated weight, and a cooling start temperature of the PE part may be differentiated for each determined driving load level, thereby preventing the performance of the PE part from being degraded and reducing consumption of current for cooling.

Second, the PE part may be cooled in advance by lowering the cooling start reference temperature of the PE part under an overload driving condition of a vehicle, and thus the temperature of the PE part may be prevented from rapidly increasing, thereby preventing the performance of the PE part from being degraded and preventing the PE part from deteriorating, Third, the temperature of the PE part may be prevented from rapidly increasing by cooling the PE part in advance, and thus consumption of current for cooling the PE part may be reduced compared with the conventional case in which consumption of current for cooling the PE part is high when the temperature of the PE part rises rapidly.

Fourth, the driver may be notified about cooling control information, e.g., information about a differentiated cooling start temperature of the PE part for each driving load level through pop-up of the information through an in-vehicle display, thereby improving impression of a smart vehicle.

The present disclosure has been described in detail with reference to preferred embodiments thereof. However, it will be appreciated by those skilled in the art that changes may be made in these embodiments without departing from the principles and spirit of the present disclosure, the scope of which is defined in the appended claims and their equivalents.

What is claimed is:

1. A system for controlling cooling of a power electronics (PE) part of an electric vehicle, the system comprising:
    a driving load determiner configured to estimate a weight of the vehicle and to determine a driving load level based on the estimated weight; and a PE part temperature controller configured to change a cooling start reference temperature of the PE part depending on the determined driving load level.

2. The system of claim 1, further comprising a pop-up notification controller configured to provide a driver with information indicating that the cooling start reference temperature of the PE part is changed.

3. The system of claim 1, wherein the driving load determiner comprises:
a weight estimator configured to estimate the weight of the vehicle using a driving force of the vehicle and a slope; and
a driving load level determiner configured to determine any one of a plurality of preset driving load levels, to which the estimated weight belongs.

4. The system of claim 1, wherein the PE part temperature controller is configured to apply a first cooling control map in which the cooling start reference temperature of the PE part is set to a predetermined temperature or greater when the determined driving load level is a normal load level, and to apply a second cooling control map in which the cooling start reference temperature of the PE part is set to be less than the predetermined temperature when the determined driving load level is an overload level.

5. The system of claim 4, wherein the second cooling control map is configured by multiplying the first cooling control map by an offset or a factor based on a driving load level belonging to an overload level.

6. The system of claim 4, wherein the second cooling control map is configured to vary the cooling start reference temperature of the PE part differently for each driving load level belonging to an overload level.

7. A system for controlling cooling of a power electronics (PE) part of an electric vehicle, the system comprising:
a driving load determiner configured to estimate a weight of the vehicle and to determine a driving load level based on the estimated weight;
a PE part temperature controller configured to change a cooling start reference temperature of the PE part depending on the determined driving load level;
a pop-up notification controller configured to provide a driver with information indicating that the cooling start reference temperature of the PE part is changed, wherein, when the driving load level is an overload level, the pop-up notification controller is configured to perform control of displaying a pop-up window indicating that smart care is currently performed on the PE part on an in-vehicle display.

8. The system of claim 7, wherein the driving load determiner comprises:
a weight estimator configured to estimate the weight of the vehicle using a driving force of the vehicle and a slope; and
a driving load level determiner configured to determine any one of a plurality of preset driving load levels, to which the estimated weight belongs.

9. The system of claim 7, wherein the PE part temperature controller is configured to apply a first cooling control map in which the cooling start reference temperature of the PE part is set to a predetermined temperature or greater when the determined driving load level is a normal load level, and to apply a second cooling control map in which the cooling start reference temperature of the PE part is set to be less than the predetermined temperature when the determined driving load level is an overload level.

10. The system of claim 9, wherein the second cooling control map is configured by multiplying the first cooling control map by an offset or a factor based on a driving load level belonging to an overload level.

11. The system of claim 9, wherein the second cooling control map is configured to vary the cooling start reference temperature of the PE part differently for each driving load level belonging to an overload level.

12. A method of controlling cooling of a power electronics (PE) part of an electric vehicle, the method comprising:
estimating a weight of the vehicle;
determining a driving load level based on the estimated weight; and
changing a cooling start reference temperature of the PE part depending on the determined driving load level.

13. The method of claim 12, further comprising providing a driver with information indicating that the cooling start reference temperature of the PE part is changed through pop-up of the information.

14. The method of claim 13, wherein providing the driver with the information comprises, when the driving load level is an overload level, displaying a pop-up window indicating that smart care is currently performed on the PE part on an in-vehicle display.

15. The method of claim 12, wherein estimating the weight of the vehicle is performed according to $$m = \frac{\int_{t0}^{t1} \left[ \frac{\eta_{RD}}{r_{tire}} (\tau_{Mot}^{BeAj}) - (f_0 + f_1 v + f_2 v^2) \right] dt}{\left[ \Delta v + \int_{t0}^{t1} g\sin\theta dt \right]}$$

using a driving force of the vehicle and a slope, where m is an estimated weight, $\eta_{RD}$ is efficiency during deceleration, $r_{tire}$ is a dynamic radius of a tire, $\tau_{Mot}^{BeAj}$ is torque of a motor, $f_0$, $f_1$, and $f_2$ are driving loads, g is gravitational acceleration, and θ is a slope (an inclination angle).

16. The method of claim 12, wherein determining the driving load level based on the estimated weight comprises determining any one of a plurality of preset driving load levels, to which the estimated weight belongs.

17. The method of claim 12, further comprising:
applying a first cooling control map in which the cooling start reference temperature of the PE part is set to a predetermined temperature or greater when the determined driving load level is a normal load level; and
applying a second cooling control map in which the cooling start reference temperature of the PE part is set to be less than the predetermined temperature when the determined driving load level is an overload level.

18. The method of claim 17, wherein the second cooling control map is configured by multiplying the first cooling control map by an offset or a factor based on a driving load level belonging to an overload level.

19. The method of claim 17, wherein the second cooling control map is configured to set the cooling start reference temperature of the PE part differently for each driving load level belonging to an overload level.

* * * * *

UNITED STATES PATENT AND TRADEMARK OFFICE
CERTIFICATE OF CORRECTION

| | |
|---|---|
| PATENT NO. | : 11,760,206 B2 |
| APPLICATION NO. | : 17/341659 |
| DATED | : September 19, 2023 |
| INVENTOR(S) | : Jung Min Cha |

It is certified that error appears in the above-identified patent and that said Letters Patent is hereby corrected as shown below:

On the Title Page

Item (30), in Column 1, under "Foreign Application Priority Data", Line 1, delete "10-2020-0418235" and insert -- 10-2020-0148235 --.

Signed and Sealed this
Twelfth Day of December, 2023

Katherine Kelly Vidal
*Director of the United States Patent and Trademark Office*